(12) United States Patent
Peng et al.

(10) Patent No.: US 10,573,393 B1
(45) Date of Patent: Feb. 25, 2020

(54) METHOD FOR DETECTING STORING STATES OF SOLID STATE STORAGE DEVICE

(71) Applicant: STORART TECHNOLOGY CO., LTD., Hsinchu (TW)

(72) Inventors: Hsiang-En Peng, Hsinchu (TW); Sheng-Han Wu, Hsinchu (TW)

(73) Assignee: STORART TECHNOLOGY(SHENZHEN) CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/198,996

(22) Filed: Nov. 23, 2018

(51) Int. Cl.
| | | |
|---|---|---|
| G11C 16/06 | (2006.01) | |
| G11C 16/26 | (2006.01) | |
| G06F 11/10 | (2006.01) | |
| G11C 29/52 | (2006.01) | |
| H03M 13/45 | (2006.01) | |
| G11C 11/56 | (2006.01) | |
| G11C 16/04 | (2006.01) | |

(52) U.S. Cl.
CPC .......... *G11C 16/26* (2013.01); *G06F 11/1068* (2013.01); *G11C 29/52* (2013.01); *H03M 13/45* (2013.01); *G11C 11/5642* (2013.01); *G11C 11/5671* (2013.01); *G11C 16/0483* (2013.01)

(58) Field of Classification Search
CPC ...... G11C 16/26; G11C 29/52; G11C 11/5642; G11C 11/5671; G11C 16/0483; G06F 11/1068; H03M 13/45
USPC .................................................... 365/185.21
See application file for complete search history.

(56) References Cited

U.S. PATENT DOCUMENTS

2015/0043282 A1* 2/2015 Shin ................... G11C 16/3495
365/185.21

* cited by examiner

*Primary Examiner* — Huan Hoang
(74) *Attorney, Agent, or Firm* — Li & Cai Intellectual Property (USA) Office

(57) ABSTRACT

A method for detecting storing states of a solid state storage device is provided, including steps of: applying sensing voltages to memory units; comparing threshold voltages of the memory units with the sensing voltages and accordingly to define the storing states including a strong correct region, a weak correct region, a strong error region and a weak error region, in which the memory units are classified; calculating the number of the memory units in the storing states; calculating a strong correct ratio of the number of the memory units in the strong correct region to the number of the memory units in the strong and weak correct regions; calculating a strong error ratio of the number of the memory units in the strong error region to the number of the memory units in the strong and weak error regions; and generating a log-likelihood ratio based on said ratios.

9 Claims, 10 Drawing Sheets

US 10,573,393 B1

METHOD FOR DETECTING STORING STATES OF SOLID STATE STORAGE DEVICE

FIELD OF THE DISCLOSURE

The present disclosure relates to a solid state storage device, and more particularly to a method of detecting storing states of a solid state storage device.

BACKGROUND OF THE DISCLOSURE

Memories are seeing widespread use in recent years. However, memories may be damaged by multiple times of erasing and writing data, resulting in an increased probability of error and a significantly reduced reliability of the non-volatile memory. Therefore, it is necessary to improve the reliability of the non-volatile memory by applying design techniques such as error correction techniques, such that a lifetime of a product is prolonged and an operation state of the product is more stable.

An error correction module for correcting error data read by the non-volatile memory is disposed in a control circuit of the memory to eliminate error caused by external factors in the non-volatile memory, thereby prolonging the lifetime of the non-volatile memory. A common error correction coding technology is such as a Bose-Chaudhuri-Hochquenghem (BCH) coding technology, which is capable of fast computation and has a correction capability that increases with the increase of the number of redundant bits. However, with the improvement of manufacturing technologies of the non-volatile memory, the BCH coding technology has been unable to provide sufficient correction capability. Therefore, a Low Density Parity Code (LDPC) error correction technology widely used in the field of communication and having a strong correction capability is now being used in data storage.

SUMMARY OF THE DISCLOSURE

An object of the present disclosure is to provide a method of detecting storing states of a solid state storage device, which has an improved error correction capability for stored data of a non-volatile memory.

The method for detecting the storing states of the solid state storage device including a plurality of memory units includes the following steps: setting a plurality of sensing voltages having different voltage values, the sensing voltages including a low level sensing voltage, a middle level sensing voltage and a high level sensing voltage, wherein the low level sensing voltage is smaller than the middle level sensing voltage, and the high level sensing voltage is larger than the middle level sensing voltage; applying the middle level sensing voltage to each of the memory units, and then applying other sensing voltages among the plurality of sensing voltages to each of the memory units; comparing a threshold voltage of each of the memory units with the sensing voltages and accordingly defining a plurality of storing states including a strong correct region, a weak correct region, a strong error region and a weak error region; calculating the number of the memory units classified in each of the strong correct region, the weak correct region, the strong error region and the weak error region; calculating a strong correct ratio of the number of the memory units in the strong correct region to the number of the memory units in the strong correct region and the weak correct region; calculating a strong error ratio of the number of the memory units in the strong error region to the number of the memory units in the strong error region and the weak error region; and generating a log-likelihood ratio based on the strong correct ratio and the strong error ratio.

As described above, the present disclosure provides the method for detecting the storing states of the solid state storage device, which divides an entire region into the strong correct region, the weak correct region, the strong error region, and the weak error region for defining the storing states of the memory cells of the non-volatile memory by applying N sensing voltages. The number of the memory cells having the different threshold voltages in the different divided regions is calculated. Further, the log-likelihood ratios are calculated based on the number of the memory cells and inputted to the decoder. Therefore, the decoder may decode the data bit values with different log-likelihood ratios for different storing states, thereby improving a probability of obtaining correct data bit values.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
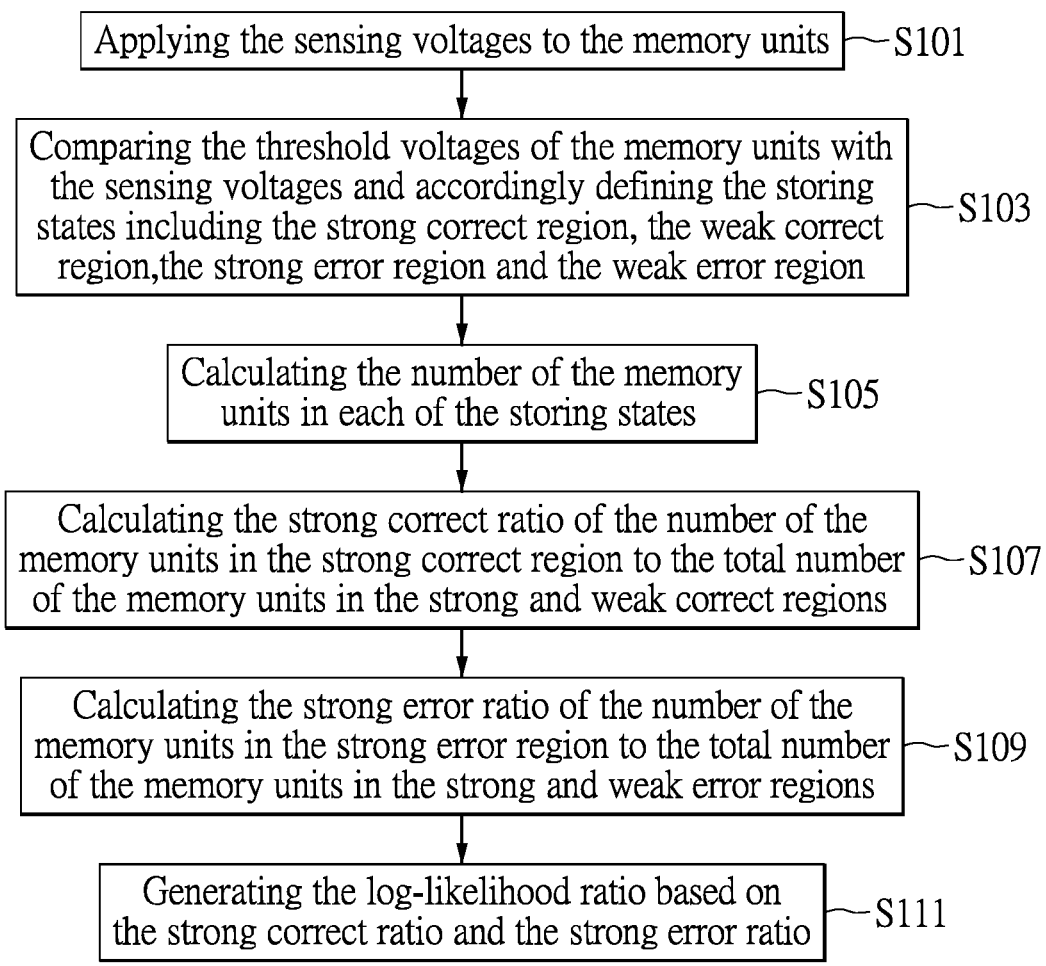
FIG. 1 is a flowchart of a method for detecting storing states of a solid state storage device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a flowchart of a method for detecting storing states of a solid state storage device according to a first embodiment of the present disclosure.

As shown in FIG. 1, in the embodiment, the method for detecting the storing states of the solid state storage device may include the following steps S101~S111 for the solid state storage device. The solid state storage device may include a memory such as an NAND non-volatile flash memory, which may include a memory array in which memory units (i.e., memory cells) are arranged. Each of the memory units may be used to store N bits, wherein N is an integer value greater than or equal to 1.

In step S101, sensing voltages are applied sequentially or simultaneously to the each of the memory units, where the sensing voltages may have different voltage values. An order of sequentially applying the sensing voltages may be dependent on their voltage values. Alternatively, a middle level sensing voltage is first applied, and then other sensing voltages are applied sequentially in an order from small to large of differences between the other sensing voltages and the middle level sensing voltage.

Figure 6:
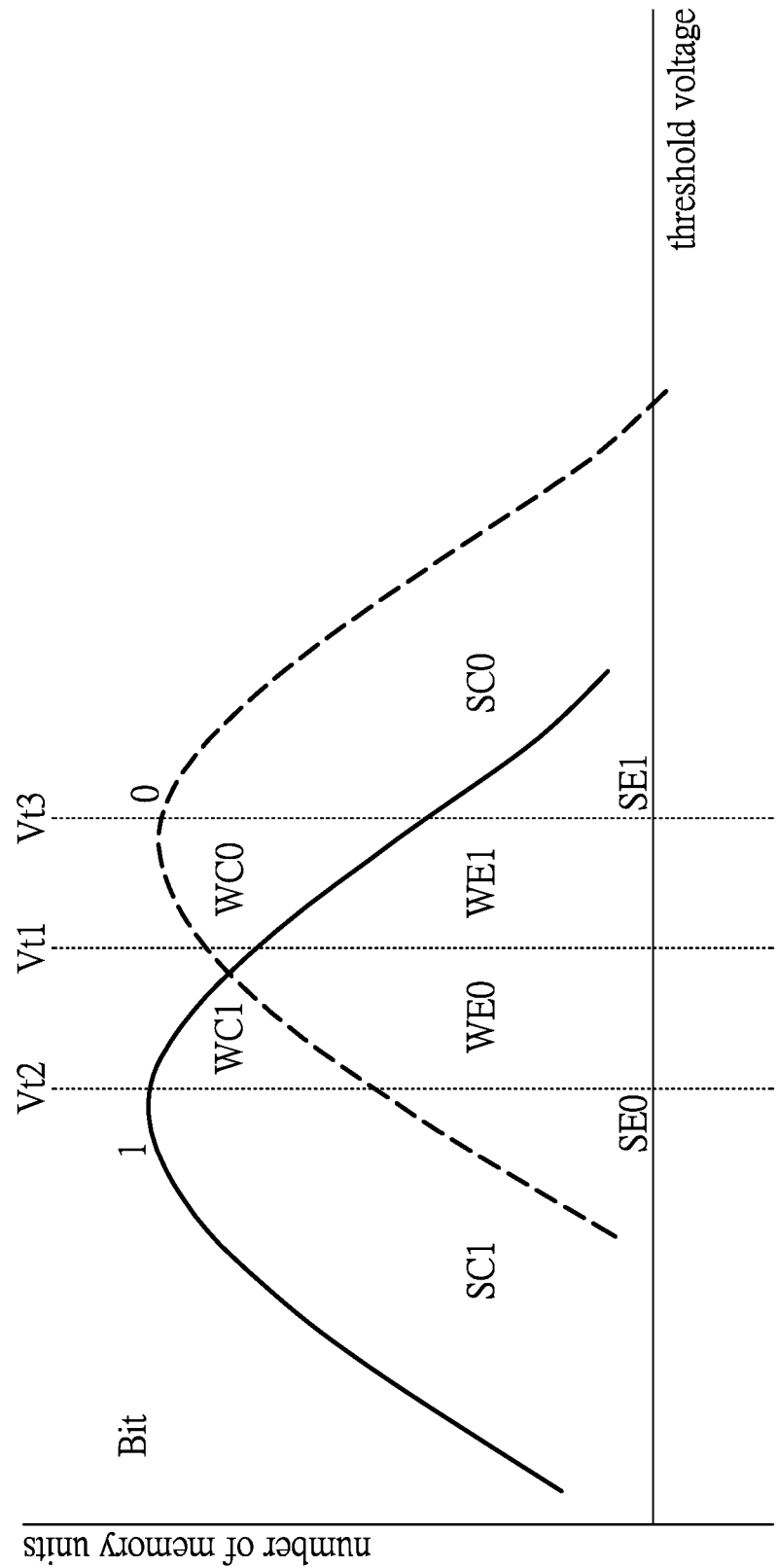
FIG. 6 is a curve diagram of the number of single-level cell (SLC) memories versus threshold voltages for a solid state storage device to which sensing voltages are applied according to an embodiment of the present disclosure.

For example, three sensing voltages including a low level sensing voltage, the middle level sensing voltage and a high level sensing voltage are applied, but the present disclosure is limited thereto. More specifically, the method of the embodiment may further include the following steps: obtaining the middle level sensing voltage; and setting the low level sensing voltage and the high level sensing voltage, for example, based on a voltage value of the middle level sensing voltage. As shown in FIG. 6, a middle level sensing voltage Vt1, a low level sensing voltage Vt2 and a high level sensing voltage are applied. It should be understood that, in the embodiment, a sensing voltage smaller than the middle level sensing voltage is represented as the low level sensing voltage, and a sensing voltage larger than the middle level sensing voltage is represented as the high level sensing voltage. That is, the "low" of the low level sensing voltage and "high" of the high level sensing voltages are only used to indicate relationships between the two, and the "middle" of the middle level sensing voltage, rather than limiting the sensing voltage to be smaller than, larger than or equal to a specific voltage value, or to fall within a specific voltage range.

When a power supply or other voltage supply component supplies the sensing voltages to the memory array, the memory units disposed closer to the power supply may receive the sensing voltages earlier than the memory units disposed farther from the power supply. The orders of processing the memory units of the memory array are exemplified as follows. For example, one sensing voltage is supplied to each of the memory units, and then another sensing voltage different from the one sensing voltage is supplied to each of the memory units, and so on, thereby applying sequentially the different sensing voltages to each of the memory units. Alternatively, the sensing voltages having different voltage values from each other are supplied to one memory unit, and then said sensing voltages are supplied to another memory unit after a storing state of the one memory unit is detected by performing the following steps, and so on.

In step S103, a threshold voltage of each of the memory units is compared with the sensing voltages, and the storing states of the memory units are defined accordingly. The storing states may include a strong correct (SC) region, a weak correct (WC) region, a strong error (SE) region, a weak error region (WE), etc. In detail, each of the memory units may be a memory cell having a floating gate transistor or a charge trap. For example, the floating gate transistor may be used to store hot carriers, and the threshold voltage of the floating gate transistor may be determined according to the number of the stored hot carriers. Therefore, it should be understood that the threshold voltages of the memory units are variable values, and the sensing voltage values to be applied to the memory units may be determined according to different threshold voltage values.

In the embodiment, the method may further include the following steps: obtaining the number of bits that each of the memory units can store; determining the number and the voltage values of the sensing voltages to be applied to the memory units based on the number of the bits that each of the memory units can store. That is, while three sensing voltages are applied to define four regions in this embodiment, the present disclosure is not limited thereto. In practice, more sensing voltages may be supplied to obtain more divided regions so as to more precisely define the storing states of the memory units.

In step S105, the number of the memory units in each of the storing states is calculated; for example, an area of each of the strong correct region, the weak correct region, the strong error region and the weak error region is calculated. The areas of the regions vary with the threshold voltages of the memory units and the sensing voltages applied to the memory units.

In step S107, a strong correct ratio (SCR) of the number of the memory units in the strong correct region to the number of the memory units in the strong and weak correct regions is calculated, which is expressed by the following equation:

$$SCR = \frac{SC}{SC + WC},$$

wherein SCR represents the strong correct ratio, which may fall within a range of 0.0% to 100%, such as SCR=90%, but the present disclosure is not limited thereto, SC represents the number of the memory units in the strong correct region, and WC represents the number of the memory units in the weak correct region.

In step S109, a strong error ratio (SER) of the number of the memory units in the strong error region to the number of the memory units in the strong and weak error regions is calculated, which is expressed by the following equation:

$$SER = \frac{SE}{SE + WE},$$

wherein SCR represents the strong error ratio, which may fall within a range of 0.0% to 100%, such as SER=90%, but the present disclosure is not limited thereto, SE represents the number of the memory units in the strong error region, and WE represents the number of the memory units in the weak error region.

In step S111, a log-likelihood ratio (LLR) is calculated based on the strong correct ratio and the strong error ratio.

Figure 2A:
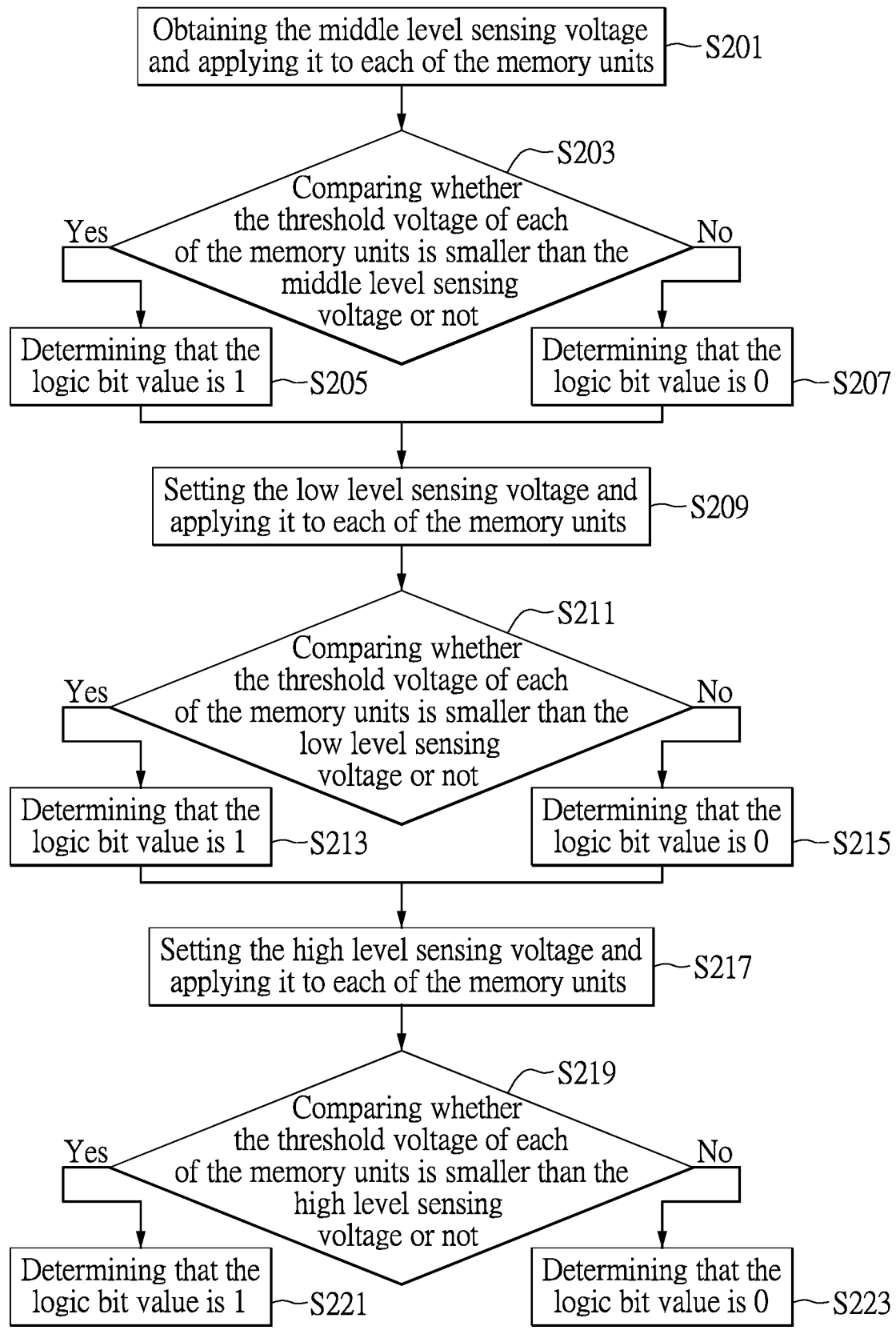
FIG. 2a is a flowchart of a method for detecting storing states of a solid state storage device that includes a step of applying sensing voltages and determining a bit value of a memory unit according to a second embodiment of the present disclosure.
Figure 2B:
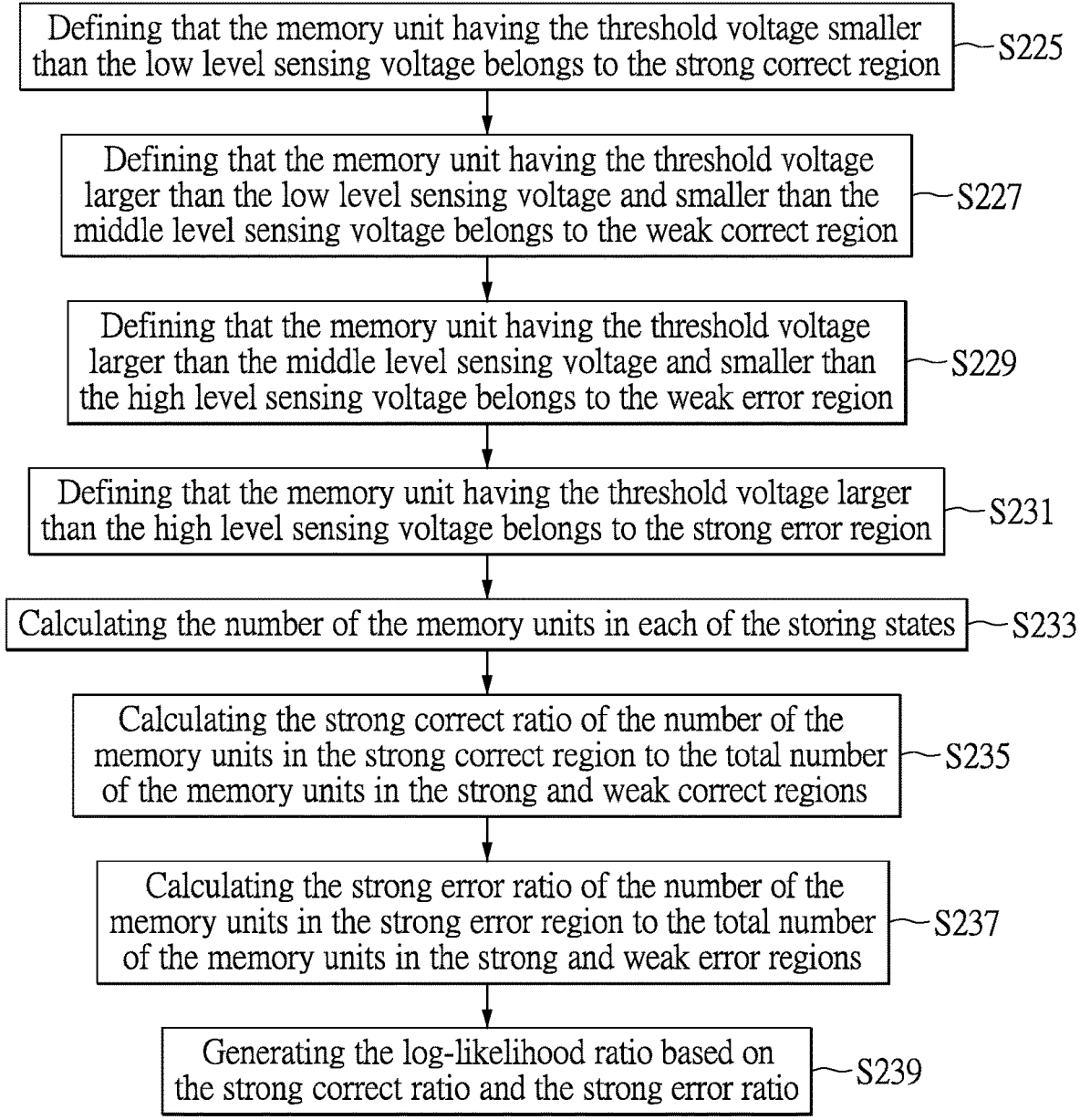
FIG. 2b is a flowchart of the method for detecting the storing states of the solid state storage device that includes a step of calculating a log-likelihood ratio according to the second embodiment of the present disclosure.

Reference is made to FIGS. 2*a* and 2*b*, FIG. 2*a* is a flowchart of a method for detecting storing states of a solid state storage device that includes a step of applying sensing voltages and determining a bit value of a memory unit according to a second embodiment of the present disclosure, and FIG. 2*b* is a flowchart of the method for detecting the storing states of the solid state storage device that includes a step of calculating a log-likelihood ratio according to the second embodiment of the present disclosure. In the embodiment, the method for detecting the storing states of the solid state storage device may include steps S201 to S203 shown in FIG. 2*a* and steps S225 to S239 for each of the memory units for accessing an original logic bit value of "1".

First, as shown in FIG. 2*a*, the steps S201 to S203 are described as follows.

In step S201, the middle level sensing voltage such as the middle level sensing voltage Vt1 shown in FIG. 6 is obtained and then applied to the memory unit. In the embodiment, the middle level sensing voltage may be a factory setting value.

However, as the non-volatile memory is used for a longer period of time, a distance between two curves respectively representing logic bit values of "1" and "0" as shown in FIG. 6 may be changed and thus the middle level sensing voltage may need to be reset.

In step S203, the threshold voltage of the memory unit is compared with the middle level sensing voltage. If the threshold voltage of the memory unit is smaller than the middle level sensing voltage, a logic bit value stored in the memory unit is determined as "1" in step S205. If the threshold voltage of the memory unit is larger than the middle level sensing voltage, a logic bit value stored in the memory unit is determined as "0" in step S207.

In step S209, the low level sensing voltage such as the low level sensing voltage Vt2 shown in FIG. 6 is set based on the middle level sensing voltage, and then the low level sensing voltage is applied to the memory unit.

In step S211, the threshold voltage of the memory unit is compared with the low level sensing voltage. If the threshold voltage of the memory unit is smaller than the low level sensing voltage, a logic bit value stored in the memory unit is determined as "1" in step S213. If the threshold voltage of the memory unit is larger than the low level sensing voltage, a logic bit value stored in the memory unit is determined as "0" in step S215.

In step S209, the high level sensing voltage such as the high level sensing voltage Vt3 as shown in FIG. 6 is set based on the middle level sensing voltage and low level sensing voltage, and then the high level sensing voltage is applied to the memory unit.

For example, a difference between the low level sensing voltage and the middle level sensing voltage may be equal to a difference between the high level sensing voltage and the middle level sensing voltage, but the present disclosure is not limited thereto.

In step S219, the threshold voltage of the memory unit is compared with the high level sensing voltage. If the threshold voltage of the memory unit is smaller than the high level sensing voltage, a logic bit value stored in the memory unit is determined as "1" in step S221. If the threshold voltage of the memory unit is larger than the high level sensing voltage, a logic bit value stored in the memory unit is determined as "0" in step S223.

After the sensing voltages are sequentially applied and then compared with the threshold voltage of the memory unit in steps S201 to S223 as described above, the storing states of the memory units are defined in steps S225~S239 shown in FIG. 2*b* and described as follows.

In step S225, the memory unit having the threshold voltage smaller than the low level sensing voltage is defined as belonging to the strong correct region. More specifically, as the curve representing the logic bit value of "1" shown in FIG. 6, when the memory unit having the threshold voltage smaller than the low level sensing voltage Vt2, a logic bit value stored in the memory unit is determined as "1" and the memory unit is defined as belonging to the strong correct region SC1.

In step S227, the memory unit having the threshold voltage that is larger than the low level sensing voltage and smaller than the middle level sensing voltage is defined as belonging to the weak correct region. More specifically, as the curve representing the logic bit value of "1" shown in FIG. 6, when the memory unit has the threshold voltage that is larger than the low level sensing voltage Vt2 and smaller than the middle level sensing voltage Vt1, that is, the threshold voltage falls within a range between the low level sensing voltage Vt2 and the middle level sensing voltage Vt1, a logic bit value stored in the memory unit is determined as "1", and the memory unit is defined as belonging to the weak correct region WC1.

In step S229, the memory unit having the threshold voltage that is larger than the middle level sensing voltage and smaller than the high level sensing voltage is defined as belonging to the weak error region. As the curve representing the logic bit value of "1" shown in FIG. 6, when the memory unit having the threshold voltage that is larger than the middle level sensing voltage Vt1 and smaller than the high level sensing voltage Vt3, that is, the threshold voltage falls within a range between the low level sensing voltage Vt1 and the middle level sensing voltage Vt3, a logic bit value stored in the memory unit is determined as "0", and the memory unit is defined as belonging to the weak error region WE1.

In step S231, the memory unit having the threshold voltage that is larger than the high level sensing voltage is defined as belonging to the strong error region. As the curve representing the logic bit value of "1" shown in FIG. 6, when the memory unit having threshold voltage that is larger than the high level sensing voltage Vt3, a logic bit value stored in the memory unit is determined as "0", and the memory unit is defined as belonging to the strong error region SE1.

In step S233, the number of the memory units in each of the storing states is calculated. That is, an area of each of the strong correct region SC1, the weak correct region WC1, the strong error region SE1 and the weak error region WE1 is calculated.

In step S235, the strong correct ratio of the number of the memory units in the strong correct region to the number of the memory units in the strong and weak correct regions is calculated. More specifically, as the curve representing the logic bit value of "1" shown in FIG. 6, an area of the strong correct region SC1 and areas of the weak correct region WC1 are calculated. Further, the strong correct ratio of the area of the strong correct region SC1 to the areas of the strong correct region SC1 and weak correct region WC1 is calculated.

In step S237, the strong error ratio of the number of the memory units in the strong error region to the number of the memory units in the strong error region and the weak error region is calculated. More specifically, as the curve representing the logic bit value of "1" shown in FIG. 6, the strong error ratio of the area of the strong error region SE1 to the areas of the strong error region SE1 and the weak error region WE1 is calculated.

In step S239, the log-likelihood ratio is generated based on the strong correct ratio and the strong error ratio.

Figure 3A:
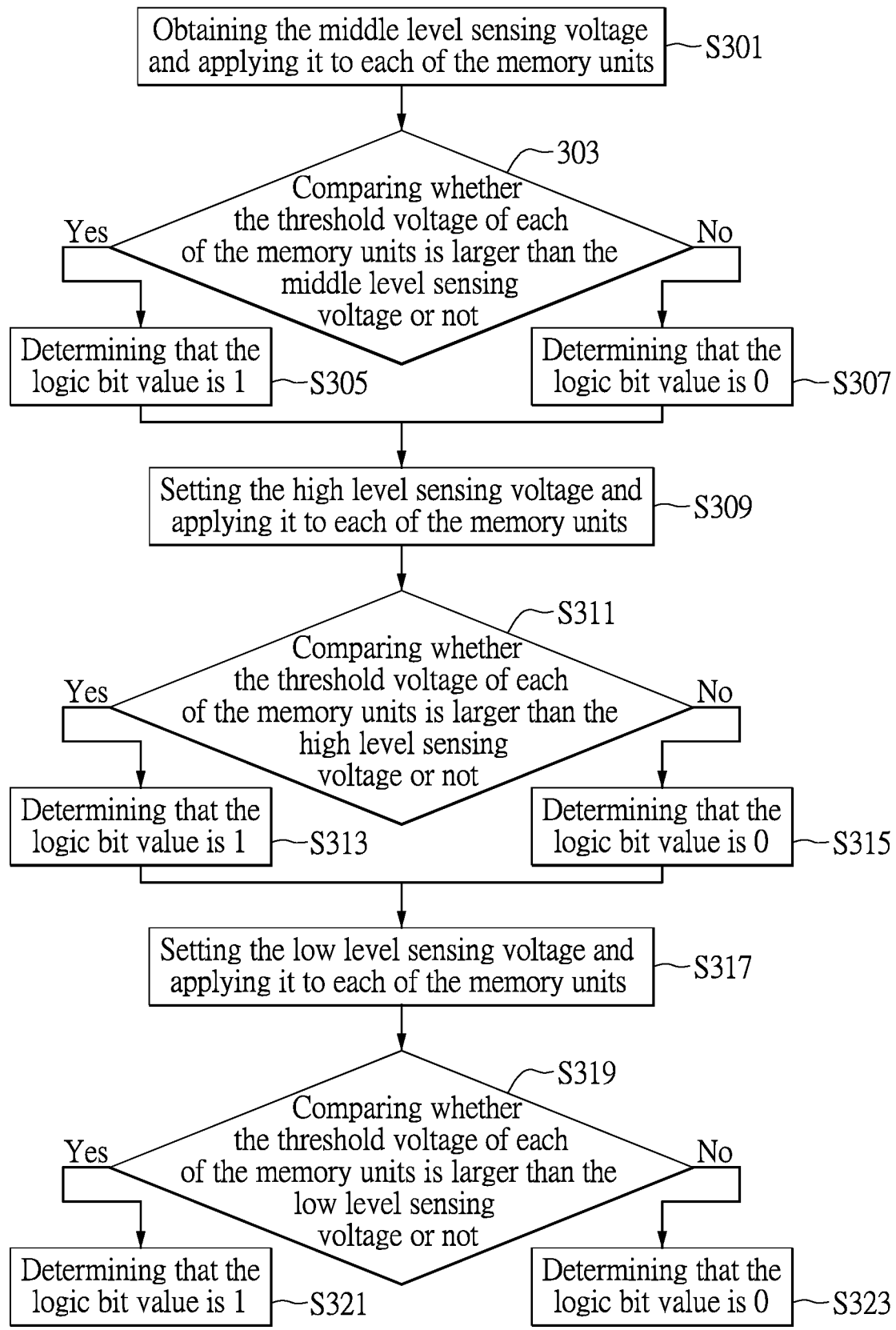
FIG. 3a is a flowchart of a method for detecting storing states of a solid state storage device that includes a step of applying sensing voltages and determining a bit value of a memory unit according to a third embodiment of the present disclosure.
Figure 3B:
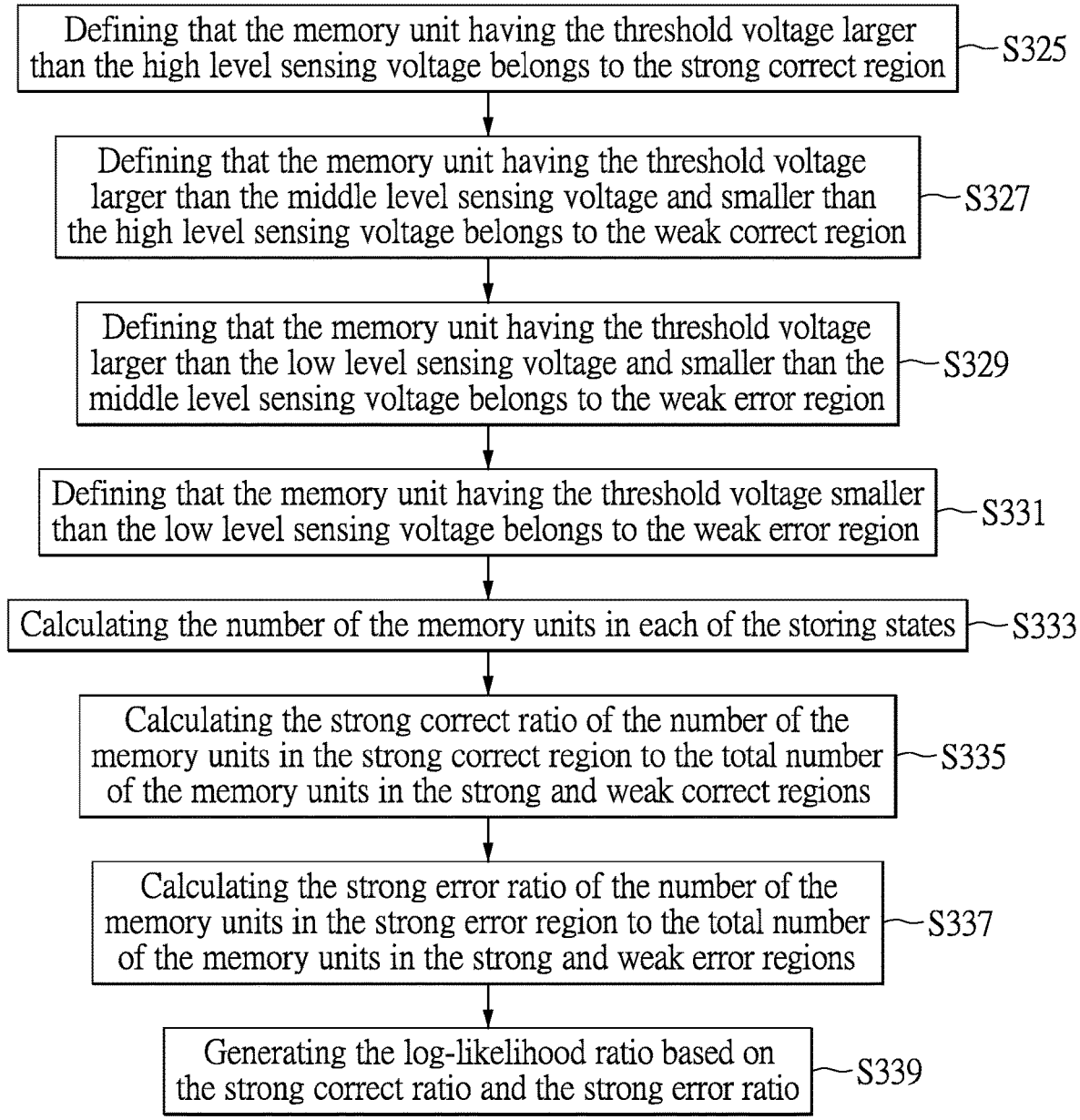
FIG. 3b is a flowchart of the method for detecting the storing states of the solid state storage device that includes a step of calculating a log-likelihood ratio according to the third embodiment of the present disclosure.

Reference is made to FIGS. 3a and 3b, FIG. 3a is a flowchart of a method for detecting storing states of a solid state storage device that includes a step of applying sensing voltages and determining a bit value of a memory unit according to a third embodiment of the present disclosure, and FIG. 3b is a flowchart of the method for detecting the storing states of the solid state storage device that includes a step of calculating a log-likelihood ratio according to the third embodiment of the present disclosure. In the embodiment, the method for detecting the storing states of the solid state storage device may include steps S301~S323 as shown in FIG. 3a and steps S325 to S339 as shown in FIG. 3b for the memory unit accessing an original logic bit value of "0". It is assumed below that each of the sensing voltages applied to the memory unit of the solid state storage device is not equal to the threshold voltage of the memory unit.

First, the steps S301~S323 as shown FIG. 3a are described as follows.

In step S301, the middle level sensing voltage such as the middle level sensing voltage Vt1 as shown in FIG. 6 is obtained and then applied to the memory unit.

In step S303, the threshold voltage of the memory unit is compared with the middle level sensing voltage. If the threshold voltage of the memory unit is larger than the middle level sensing voltage, a logic bit value stored in the memory unit is determined as "0" in step S305. If the threshold voltage of the memory unit is smaller than the middle level sensing voltage, a logic bit value stored in the memory unit is determined as "1" in step S307.

In step S309, the high level sensing voltage such as the high level sensing voltage Vt3 as shown in FIG. 6 is set and then applied to the memory unit.

In step S311, the threshold voltage of the memory unit is compared with the high level sensing voltage. If the threshold voltage of the memory unit is larger than the high level sensing voltage, a logic bit value stored in the memory unit is determined as "0" in step S313. If the threshold voltage of the memory unit is smaller than the high level sensing voltage, a logic bit value stored in the memory unit is determined as "1" in step S315.

In step S317, the low level sensing voltage such as the low level sensing voltage Vt2 as shown in FIG. 6 is set and then applied to the memory unit.

In step S319, the threshold voltage of the memory unit is compared with the low level sensing voltage. If the threshold voltage of the memory unit is larger than the low level sensing voltage, a logic bit value stored in the memory unit is determined as "1" in step S321. If the threshold voltage of the memory unit is smaller than the low level sensing voltage, a logic bit value stored in the memory unit is determined as "0" in step S323.

After the sensing voltages are sequentially applied and then compared with the threshold voltage of the memory unit in steps S301~S323 as described above, the storing state of the memory unit is defined in steps S325~S339 as shown in FIG. 3b and described as follows.

In step S325, the memory unit having the threshold voltage larger than the high level sensing voltage is defined as belonging to the strong correct region. More specifically, as the curve representing the logic bit value of "0" shown in FIG. 6, the memory unit having the threshold voltage lager than the high level sensing voltage Vt3, a logic bit value stored in the memory unit is determined as "0" and the memory unit is defined as belonging to the strong correct region SC0.

In step S327, the memory unit having the threshold voltage that is larger than the middle level sensing voltage and smaller than the high level sensing voltage is defined as belonging to the weak correct region. As the curve representing the logic bit value of "0" shown in FIG. 6, the memory unit having the threshold voltage that is larger than the middle level sensing voltage Vt1 and smaller than the high level sensing voltage Vt3, that is, the threshold voltage falls within a range between the middle level sensing voltage Vt1 and the high level sensing voltage Vt3, a logic bit value stored in the memory unit is determined as "0", and the memory unit is defined as belonging to the weak correct region WC0.

In step S329, the memory unit having the threshold voltage that is larger than the low level sensing voltage and smaller than the middle level sensing voltage is defined as belonging to the weak error region. As the curve representing the logic bit value of "0" shown in FIG. 6, the memory unit having the threshold voltage larger than the low level sensing voltage Vt2 and smaller than the middle level sensing voltage Vt1, that is, the threshold voltage falls within a range between the low level sensing voltage Vt2 and the middle level sensing voltage Vt1, a logic bit value stored in the memory unit is determined as "1", and the memory unit is defined as belonging to the weak error region WE0.

In step S331, the memory unit having the threshold voltage smaller than the low level sensing voltage is defined as belonging to the strong error region. As the curve representing the logic bit value of "0" shown in FIG. 6, if the memory unit having threshold voltage that is smaller than the low level sensing voltage Vt2, a logic bit value stored in the memory unit is determined as "1" and the memory unit is defined as belonging to the strong error region SE0.

In step S333, the number of the memory units in each of the storing states is calculated. That is, an area of each of the strong correct region SC0, the weak correct region WC0, the strong error region SE0 and the weak error region WE0 is calculated. In step S335, the strong correct ratio of the number of the memory units in the strong correct region to the number of the memory units in the strong and weak correct regions is calculated. More specifically, the area of the strong correct region SC0 and the area of the weak correct region WC0 corresponding to the curve representing the logic bit value of "0" as shown in FIG. 6 are calculated. Further, the strong correct ratio of the area of the strong correct region SC0 to the areas of the strong and weak correct regions SC0 and WC0 is calculated.

In step S337, the strong error ratio of the number of the memory units in the strong error region to the number of the memory units in the strong and weak error regions is calculated. More specifically, the area of the strong error region SE0 and the area of the weak error region WE0 corresponding to the curve representing the logic bit value of "0" as shown in FIG. 6 are calculated. Further, the strong error ratio of the area of the strong error region SE0 to the areas of the strong and weak error regions SE0 and WE0 is calculated.

In step S339, the log-likelihood ratio is generated based on the strong correct ratio and the strong error ratio.

Figure 4:
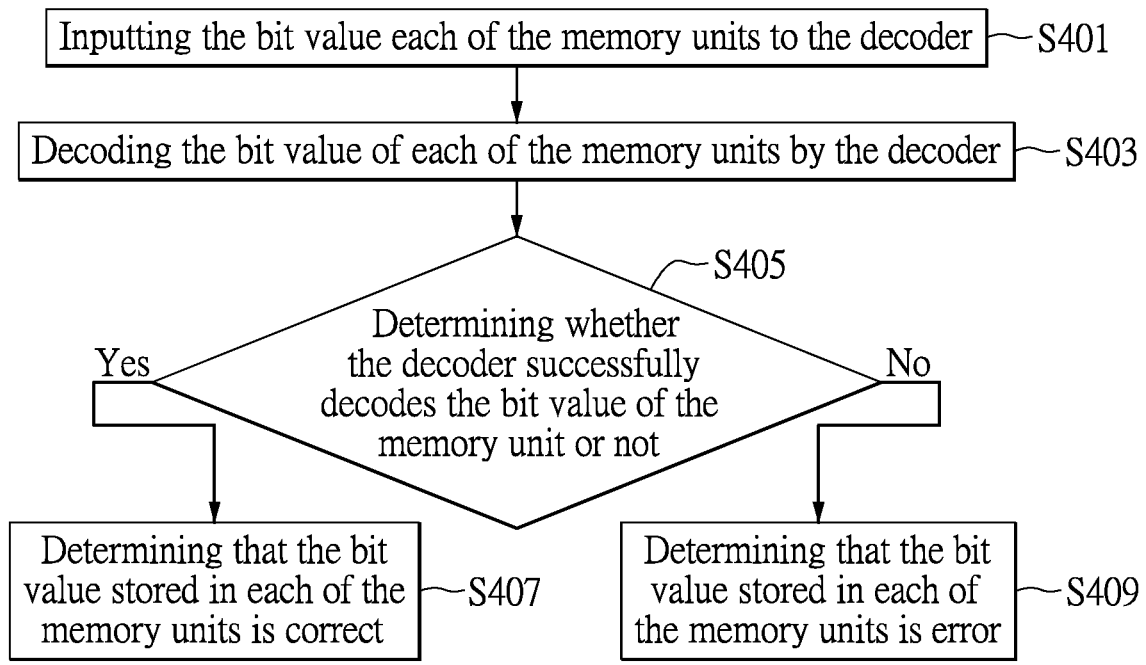
FIG. 4 is a flowchart of a method for detecting storing states of a solid state storage device that includes a step of decoding a bit value stored in a memory unit by a decoder according to a fourth embodiment of the present disclosure.

Reference is made to FIG. 4, which is a flowchart of a method for detecting storing states of a solid state storage device that includes a step of decoding a bit value stored in a memory unit by a decoder according to a fourth embodiment of the present disclosure. As shown FIG. 4, the method for detecting the storing states of the solid state storage device may include the following steps S401 to S409.

In step S401, a bit value stored in the memory unit is inputted to the decoder.

In step S403, the bit value of the memory unit is decoded by the decoder.

In step S405, it is determined whether the decoder successfully decodes the bit value stored in the memory unit, to determine whether the logic bit value of "1" is falsely judged as "0" or the logic bit value of "0" is falsely judged as "1" during a process of accessing the logic bit value by the memory unit. If the decoder successfully decodes the bit value stored in the memory unit, the bit value of data stored in the memory unit is correct in step S407. If the decoder fails to decode the bit value stored in the memory unit, it is determined that the bit value of data stored in the memory unit is erroneous in step S409.

In the embodiment, the method for detecting the storing states of the solid state storage device may include the following steps: after repeatedly testing the memory units of the volatile memory of the solid state storage device by using the above steps S401 to S409, calculating whether a correct probability of storing the data by the memory unit is larger than a correct probability threshold value or not. If the correct probability is larger than the correct probability threshold value, the memory unit is classified in the strong correct region and the number of the memory unit belonging to the strong correct region is counted. If the correct probability is not larger than the correct probability threshold value, the memory unit is classified in the weak correct region and the number of the memory unit belonging to the weak correct region is counted. The method may further include the following steps: calculating whether an error probability of storing data is larger than an error probability threshold value or not. If the error probability is larger than the error probability threshold value, the memory unit is classified in the strong error region and the number of the memory unit belonging to the strong error region is counted. If the error probability is not larger than the error probability threshold value, the number of the memory unit belonging to the weak error region is counted.

The method further include the following steps: comparing whether the number of the memory units belonging to each of the strong correct region, the weak correct region, the strong error region and the weak error region, that are divided by applying the sensing voltages in the above steps of the second and third embodiments, is consistent with a statistical result of the decoding test. If not, for example, the memory unit classified in the strong correct region by applying the sensing voltages actually belongs to the weak correct region since the memory unit has a low success probability of decoding the bit value, the number and the values of the supplied sensing voltages may be adjusted such that the regions may be correctly divided.

Figure 5:
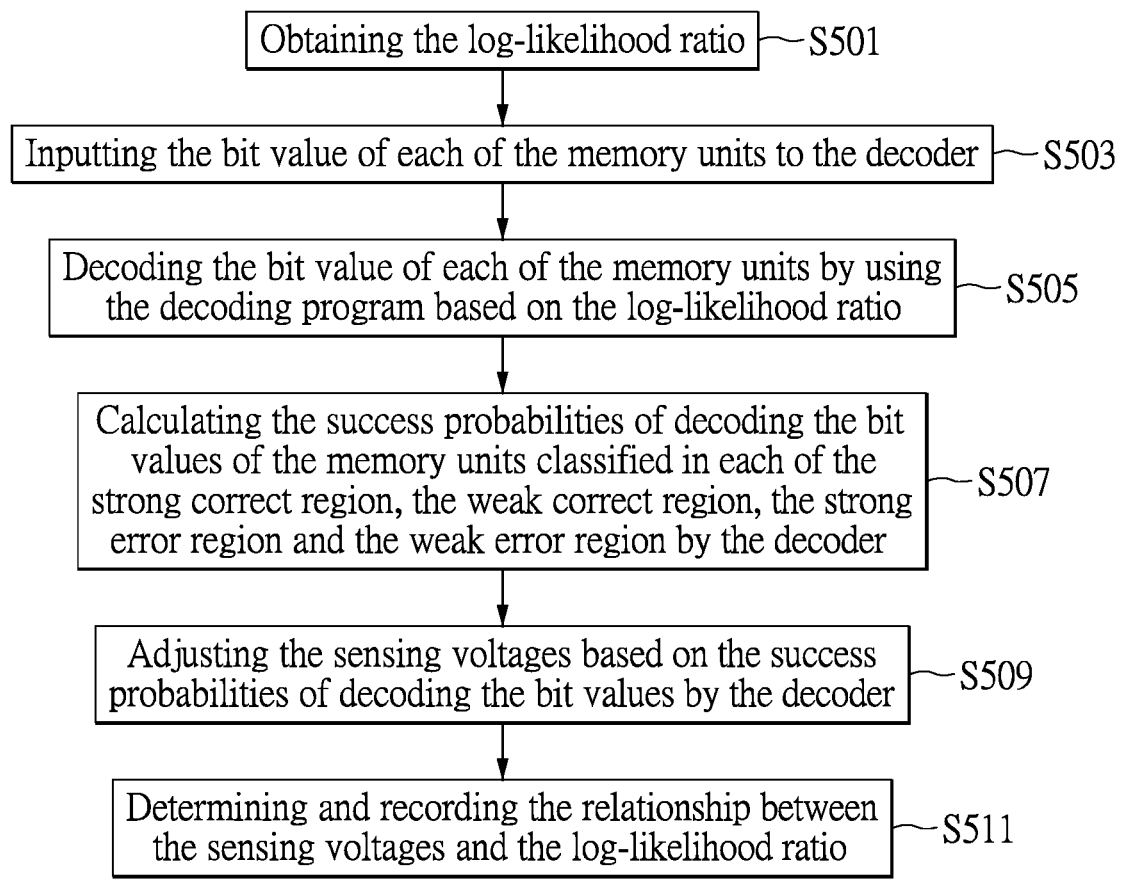
FIG. 5 is a flowchart of a method for detecting storing states of a solid state storage device that includes a step of decoding a bit value of a memory unit by a decoder with a probability decoding algorithm corresponding to a log-likelihood ratio according to a fifth embodiment of the present disclosure.

Reference is made to FIG. 5, which is a flowchart of a method for detecting storing states of a solid state storage device that includes a step of decoding a bit value of a memory unit by a decoder with a probability decoding algorithm corresponding to a log-likelihood ratio according to a fifth embodiment of the present disclosure.

As shown in FIG. 5, the method for detecting the storing states of the solid state storage device includes the following steps S501~S509.

In step S501, the log-likelihood ratio is obtained. For example, the log-likelihood ratio is generated by a control circuit of the solid state storage device by performing the above steps, and then the log-likelihood ratio is inputted to the decoder.

In step S503, the bit value of the data stored in the memory units is inputted to the decoder.

In step S505, the decoder performs a soft decoding program based on the log-likelihood ratio on the bit value of the data stored in the memory unit to decode the bit value. The log-likelihood ratio is associated with the strong correct region SC, the weak correct region WC, the strong error region SE and the weak error region WE as shown in FIG. 6. The different decoding programs may be selected for different regions. For example, the decoding program may use an algebraic decoding algorithm of BCH codes or a probability decoding algorithm of LDPC codes, but the present disclosure is not limited thereto.

Further, the decoder may perform the decoding program according to the log-likelihood ratio, especially for the strong error region, the weak error region and the weak correct region. For example, when the memory unit is classified in the strong correct region, it means that data read over multiple times by the memory unit are all correct, that is, a correct probability is high. Under such circumstances, the decoder may use a larger log-likelihood ratio for decoding. Conversely, the decoder performs a decoding program based on a smaller log-likelihood ratio for data stored in the memory units classified in the strong error region. As a result, the decoder has a probability to flip the logic bit value of a code word, that is, the decoder flips a misjudged logic bit value of "0" to an original logic bit value of "1", or flips a misjudged logic bit value of "1" to an original logic bit value of "0". That is, the decoder may perform a subsequent correction process on the logic bit value misjudged by the memory unit to successfully decode a logic bit value flipped from the misjudged logic bit value. Therefore, the decoder has an improved error correction capability such that a success probability of decoding the logic bit value is increased.

In step S507, the success probability of decoding the logic bit values stored in the memory units classified in each of the strong correct region, the weak correct region, the strong error region and the weak error region by the decoder is calculated. In the embodiment, the method for detecting the storing states of the solid state storage device includes the following steps: comparing the success probability of decoding the logic bit value by using the decoding program based on the log-likelihood ratio with a success probability of decoding the logic bit value by using a decoding program based on a preset constant bitrate as described in the fourth embodiment, and accordingly determining whether the success probability of decoding the logic bit value by using the decoding program based on the log-likelihood ratio is improved and calculating an improved amplitude.

In step S509, the sensing voltages are adjusted based on the success probability of decoding the logic bit value by the decoder. That is, if the success probability still does not meet a desired probability, the sensing voltages applied to the memory unit may be adjusted so as to adjust the log-likelihood ratio.

In step S511, the relationship between the sensing voltages and the log-likelihood ratio are determined and recorded.

Reference is made to FIG. 6, which is a curve diagram of the number of single-level cell (SLC) memories versus threshold voltages for a solid state storage device to which sensing voltages are applied according to an embodiment of the present disclosure. The non-volatile memory of the solid state storage device includes the memory units (i.e., memory cells). Different types of the memory units are distinguished from each other according to the number of data that the memory units can store. If the memory unit can only be used for storing 1 bit, such as a logic bit value of "0" or "1", the memory unit is called a single-level cell (SLC). The memory unit may store N bit data as described in the first embodiment, for the single-level cell (SLC), N=1, the number of logic combinations of which is expressed by the following equation: 2N=21=2. As the curve shown in FIG. 6, a vertical axis represents the number of the single-level cell, and a horizontal axis represents the threshold voltage of the single-level cell. The two curves respectively representing the logic bit values of "1" and "0" are created according to the relationship between the number of the memory units and the threshold voltage values.

The sensing voltages such as the middle level sensing voltage Vt1, the low level sensing voltage Vt2 and the high level sensing voltage Vt3 divide the curve representing the logic bit value of "1" into the plurality of storing states including the strong correct region SC1, the weak correct region WC1, the strong error region SE1 and the weak error region WE1, and the curve representing the logic bit value of "0" into the storing states including the strong correct region SC0, the weak correct region WC0, the strong error region SE0 and the weak error region WE0.

As shown in FIG. 6, in the embodiment, a line representing the middle level sensing voltage Vt1 is not ideally interleaved with an intersection point of the two curves representing logic bit values of "1" and "0". This means that the above steps described in the embodiments of the present disclosure can be implemented in a non-ideal state.

If a difference between the low level sensing voltage Vt2 and the middle level sensing voltage Vt1 is equal to a difference between the high level sensing voltage Vt3 and the middle level sensing voltage Vt1, the strong correct regions SC1 and SC0 divided by the two curves would be symmetrical to each other, and the weak correct regions WC1 and WC0 divided by the two curves would be symmetrical to each other, and so on, but the present disclosure is not limited thereto. Further, the strong correct regions SC1 and SC0 represent a high success probability of storing correct data by the memory cell, and the weak correct regions WC1 and WC0 represent a low probability of storing correct data by the memory cell. In contrast, the strong error regions SC1 and SC0 represent high probability of storing error data by the memory cell, and the weak error regions WC1 and WC0 represent low probability of storing error data by the memory cell. The value and the number of the applied sensing voltages may be determined according to actual requirements. The curves may be further divided into more regions to more accurately define various storing states of the memory cells by applying more sensing voltages having different voltage values.

Figure 7:
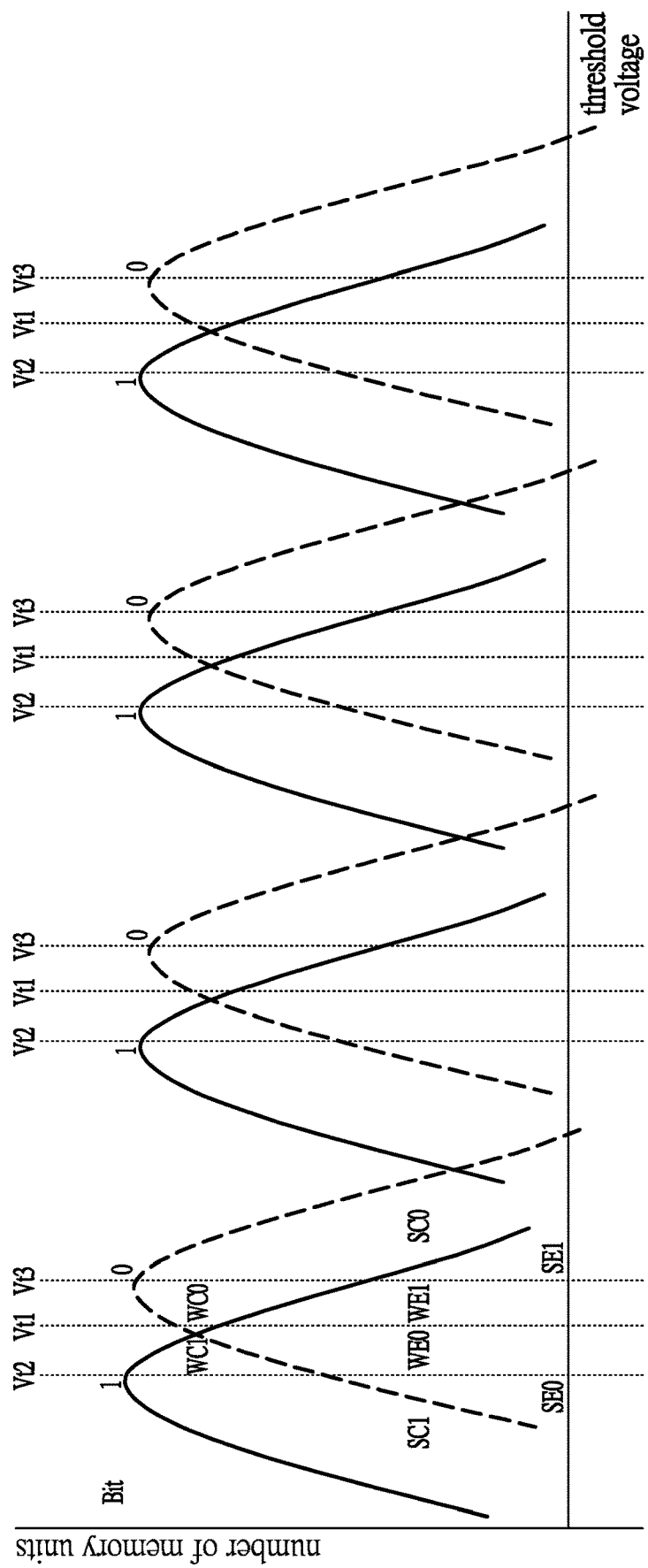
FIG. 7 is a curve diagram of the number of a triple-level cell (TLC) memories versus threshold voltages for a solid state storage device to which sensing voltages are applied according to an embodiment of the present disclosure.

Reference is made to FIG. 7, which is a curve diagram of the number of a triple-level cell (TLC) memories versus threshold voltages for a solid state storage device to which sensing voltages are applied according to an embodiment of the present disclosure. In comparison to the curve representing the single-level cell (SLC) as shown in FIG. 6, the curve representing a triple-level cell (TLC) that can store 3 bits is shown in FIG. 7. That is, the memory unit may store N bit data as described in the first embodiment, for the triple-level cell, N=3, the number of logic combinations of which is expressed by the following equation: 2N=23=8. As shown in FIG. 7, four groups of the two curves are illustrated, where the two curves represent the logic bit values of "1" and "0" respectively shown in FIG. 6. Similarly, the above steps applied to the embodiment of FIG. 6 may also be applied to TLC.

Furthermore, a multi-level cell (MLC) can store 2 data bits, and has the number of logic combinations, which is expressed by the following equation: 2N=22=4, wherein N=2. The storing states of the multi-level cell (MLC) may be marked by two groups of the two curves representing the logic bit values of "1" and "0" as shown in FIG. 6. On the other hand, a quad-level cell (QLC) can store 4 data bits and has logic combinations, which is expressed by the following equation: 2N=24=16, wherein N=4. The storing states of the quad-level cell (QLC) may be marked by eight groups of the two curves representing the logic bit values of "1" and "0" respectively, each group of the two curves are equal to the two curves shown in FIG. 6. Similarly, the above steps applied to the embodiment of FIG. 6 may also be applied to MLC and QLC. In practice, the applied sensing voltages may be further adjusted for characteristics of TLC, MLC and QLC.

Figure 8:
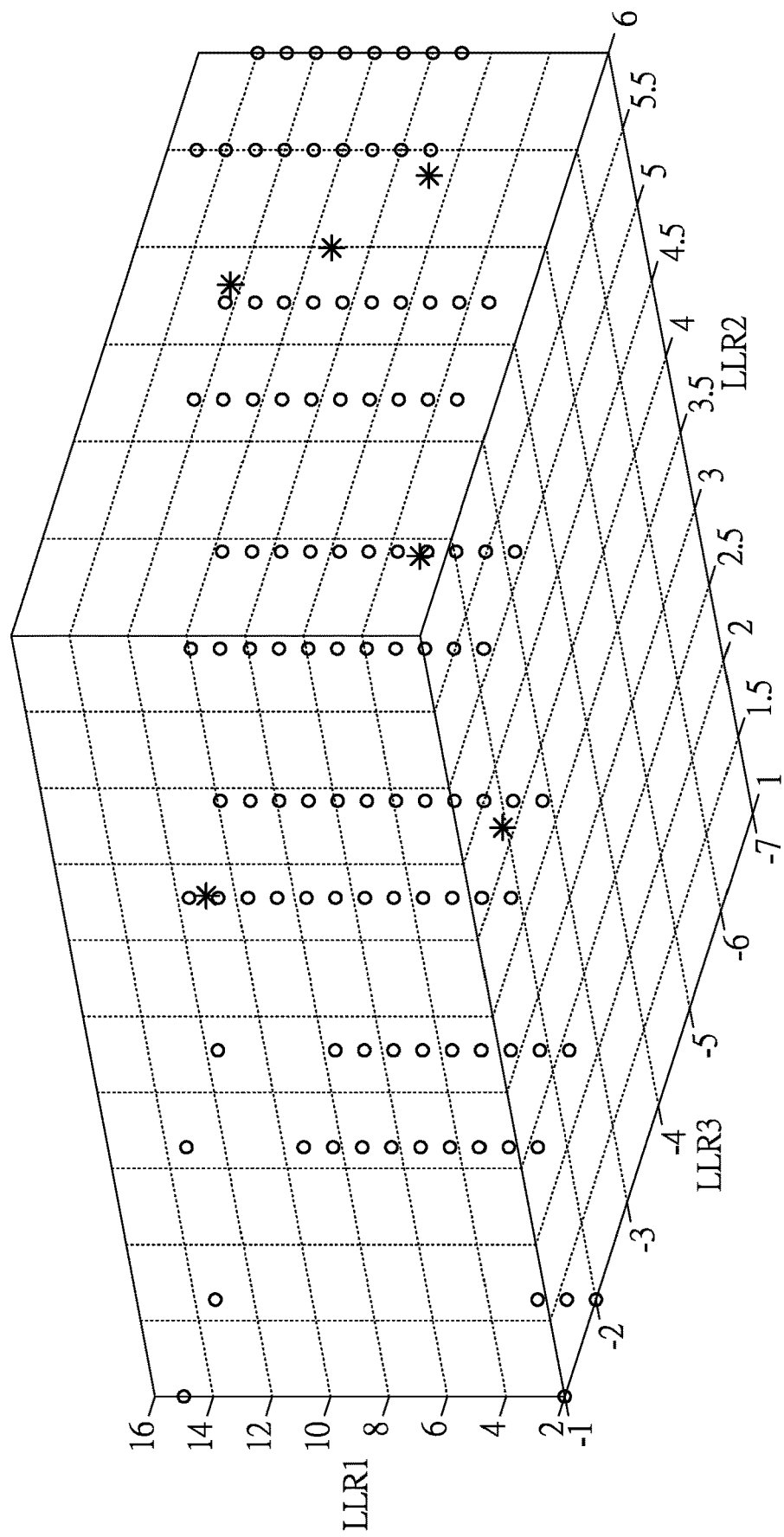
FIG. 8 is a three-dimensional diagram of practical log-likelihood ratios clustered by cluster analysis during a specific ratio interval.

Reference is made to FIG. 8, which is a three-dimensional diagram of practical log-likelihood ratios clustered by cluster analysis during a specific ratio interval. After supplying different sensing voltages, an entire region is divided into the strong correct region, the weak correct region, the strong error region and the weak error region, and the strong correct ratio, the strong error ratio and the log-likelihood ratios are calculated accordingly, with reference to the above steps of the method in the embodiments. As shown in FIG. 8, each of the axes represents N sets of log-likelihood ratios LLR1~LLRN obtained by sensing N times, and circles represent the acquired LLR groups, each of the groups having a plurality of LLR values.

The sensing voltage values may be increased or decreased to adjust the region areas of the defined storing states to obtain different ratios such as SCR and SER according to actual requirements, but the present disclosure is not limited to the number of the LLR groups as shown in FIG. 8. For example, the practical LLR values may be selected from the LLR group by cluster analysis for a specific ratio interval of the SCR and the SER of the NAND non-volatile flash memory, or a specific ratio interval of an SCR and an SER desired by the user. The practical LLR values may be inputted to the decoder as the above step S503.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

What is claimed is:

1. A method for detecting storing states of a solid state storage device including a plurality of memory units, comprising the following steps:

setting a plurality of sensing voltages having different voltage values, the sensing voltages including a low level sensing voltage, a middle level sensing voltage and a high level sensing voltage, wherein the low level sensing voltage is smaller than the middle level sensing voltage, and the high level sensing voltage is larger than the middle level sensing voltage;

applying the middle level sensing voltage to each of the memory units, and then applying other sensing voltages among the plurality of sensing voltages to each of the memory units;

comparing a threshold voltage of each of the memory units with the sensing voltages and accordingly defining a plurality of storing states including a strong correct region, a weak correct region, a strong error region and a weak error region;

calculating the number of the memory units classified in each of the strong correct region, the weak correct region, the strong error region and the weak error region;

calculating a strong correct ratio of the number of the memory units in the strong correct region to the number of the memory units in the strong correct region and the weak correct region;

calculating a strong error ratio of the number of the memory units in the strong error region to the number of the memory units in the strong error region and the weak error region; and generating a log-likelihood ratio based on the strong correct ratio and the strong error ratio.

2. The method of claim 1, wherein a difference between the low level sensing voltage and the middle level sensing voltage is equal to a difference between the high level sensing voltage and the middle level sensing voltage.

3. The method of claim 1, further comprising a step for the memory unit accessing an original logic bit value of "1":

applying the middle level sensing voltage to each of the memory units;

comparing whether the threshold voltage of each of the memory units is smaller than the middle level sensing voltage or not, and in response to the threshold voltage of each of the memory units being smaller than the middle level sensing voltage, determining that the memory unit stores the logic bit value of "1", and in response to the threshold voltage of each of the memory units being not smaller than the middle level sensing voltage, determining that the memory unit stores the logic bit value of "0";

applying the low level sensing voltage to each of the memory units;

comparing whether the threshold voltage of each of the memory units is smaller than the low level sensing voltage or not, and in response to the threshold voltage of each of the memory units being smaller than the low level sensing voltage, determining that the memory unit stores the logic bit value of "1", and in response to the threshold voltage of each of the memory units being not smaller than the low level sensing voltage, determining that the memory unit stores the logic bit value of "0";

applying the high level sensing voltage to each of the memory units;

comparing whether the threshold voltage of each of the memory units is smaller than the high level sensing voltage or not, and in response to the threshold voltage of each of the memory units being smaller than the high level sensing voltage, determining that the memory unit stores the logic bit value of "1", and in response to the threshold voltage of each of the memory units being not smaller than the high level sensing voltage, determining that the memory unit stores the logic bit value of "0";

defining that the memory unit having the threshold voltage smaller than the low level sensing voltage belongs to the strong correct region;

defining that the memory unit having the threshold voltage that is larger than the low level sensing voltage and smaller than the middle level sensing voltage belongs to the weak correct region;

defining that the memory unit having the threshold voltage that is larger than the middle level sensing voltage and smaller than the high level sensing voltage belongs to the weak error region; and defining that the memory unit having the threshold voltage larger than the high level sensing voltage belongs to the strong error region.

4. The method of claim 1, further comprising a step for the memory unit accessing an original logic bit value of "O":

applying the middle level sensing voltage to each of the memory units;

comparing whether the threshold voltage of each of the memory units is larger than the middle level sensing voltage or not, and in response to the threshold voltage of each of the memory units being larger than the middle level sensing voltage, determining that the memory unit stores the logic bit value of "0", and in response to the threshold voltage of each of the memory units being not larger than the middle level sensing voltage, determining that the memory unit stores the logic bit value of "1";

applying the high level sensing voltage to each of the memory units;

comparing whether the threshold voltage of each of the memory units is larger than the high level sensing voltage or not, and in response to the threshold voltage of each of the memory units being larger than the high level sensing voltage, determining that the memory unit stores the logic bit value of "0", and in response to the threshold voltage of each of the memory units being not larger than the high level sensing voltage, determining that the memory unit stores the logic bit value of "1";

applying the low level sensing voltage to each of the memory units;

comparing whether the threshold voltage of each of the memory units is larger than the low level sensing voltage or not, and in response to the threshold voltage of each of the memory units being larger than the low level sensing voltage, determining that the memory unit stores the logic bit value of "0", and in response to the threshold voltage of each of the memory units being not larger than the low level sensing voltage, determining that the memory unit stores the logic bit value of "1";

defining that the memory unit having the threshold voltage larger than the high level sensing voltage belongs to the strong correct region;

defining that the memory unit having the threshold voltage that is larger than the middle level sensing voltage and smaller than the high level sensing voltage belongs to the weak correct region;

defining that the memory unit having the threshold voltage that is larger than the low level sensing voltage and smaller than the middle level sensing voltage belongs to the weak error region; and defining the memory unit having the threshold voltage smaller than the low level sensing voltage belongs to the strong error region.

5. The method of claim 1, further comprising a step of:
adjusting the log-likelihood ratio by adjusting the low level sensing voltage and the middle sending voltage values.

6. The method of claim 1, further comprising a step of:
determining the plurality of sensing voltages to be applied to the plurality of memory units based on the number of regions of the plurality of storing states to be defined.

7. The method of claim 1, further comprising steps of:
obtaining the number of bits that each of the memory units can store; and determining the plurality of sensing voltages to be applied to the plurality of memory units based on the number of the bits that each of the memory units can store.

8. The method of claim 1, further comprising steps of:
inputting one or more bit values stored in each of the memory units to a decoder;

decoding the one or more bit values from each of the memory units by the decoder; and determining whether the decoder successfully decodes the one or more bit values from each of the memory units, and in response to determining that the decoder successfully decodes the one or more bit values from each of the memory units, further determining that the one or more bit values stored in the memory unit are correct, and in response to determining that the decoder does not successfully decode the one or more bit values from each of the memory units, further determining that the one or more bit values stored in the memory unit are erroneous.

9. The method of claim 8, further comprising steps of:
inputting the log-likelihood ratio to the decoder; and decoding the one or more bit values by the decoder with a decoding program based on the log-likelihood ratio.

* * * * *